United States Patent
Yu et al.

(10) Patent No.: US 8,199,619 B2
(45) Date of Patent: *Jun. 12, 2012

(54) METHOD AND SYSTEM FOR TUNING WRITE STRATEGY PARAMETERS UTILIZING DATA-TO-CLOCK EDGE DEVIATIONS

(75) Inventors: Chih-Ching Yu, Tao-Yuan Hsien (TW); Yu-Chun Lin, Hsin-Chu (TW); Hsin-Hui Wu, Hsinchu (TW)

(73) Assignee: Media Tek Inc., Science-Based Industrial Park, Hsin-Chu Hsien (TW)

( * ) Notice: Subject to any disclaimer, the term of this patent is extended or adjusted under 35 U.S.C. 154(b) by 1677 days.

This patent is subject to a terminal disclaimer.

(21) Appl. No.: 11/307,365

(22) Filed: Feb. 3, 2006

(65) Prior Publication Data

US 2007/0183290 A1     Aug. 9, 2007

(51) Int. Cl.
*G11B 7/12* (2012.01)

(52) U.S. Cl. .............. 369/47.5; 369/116; 369/53.26; 369/59.1

(58) Field of Classification Search .............. None
See application file for complete search history.

(56) References Cited

U.S. PATENT DOCUMENTS

| | | | |
|---|---|---|---|
| 6,925,041 B2 | 8/2005 | Kai et al. | |
| 7,006,420 B1 * | 2/2006 | Hsu et al. | 369/59.12 |
| 2003/0058765 A1 | 3/2003 | Schreurs | |
| 2003/0169656 A1 | 9/2003 | Chou | |
| 2004/0022151 A1 * | 2/2004 | Furumiya et al. | 369/47.53 |
| 2004/0100885 A1 * | 5/2004 | Nakamura et al. | 369/47.51 |
| 2005/0030860 A1 | 2/2005 | Gage | |
| 2005/0099925 A1 * | 5/2005 | Nakajo | 369/59.12 |
| 2006/0262692 A1 * | 11/2006 | Yu et al. | 369/59.11 |
| 2008/0123500 A1 * | 5/2008 | Yu | 369/59.11 |

FOREIGN PATENT DOCUMENTS

| | | |
|---|---|---|
| TW | I227882 | 2/2005 |
| TW | I235992 | 7/2005 |
| WO | 2004075413 A1 | 9/2004 |
| WO | 2005022519 A2 | 3/2005 |

* cited by examiner

*Primary Examiner* — Lixi C Simpson
(74) *Attorney, Agent, or Firm* — Winston Hsu; Scott Margo

(57) ABSTRACT

A method for tuning a plurality of write strategy parameters of an optical storage device includes detecting a plurality of patterns. Each pattern corresponds to a pit or a land on a phase-changed type optical storage medium accessed by the optical storage device. The method further includes performing calculations corresponding to a plurality of data types and generating a plurality of data-to-clock edge deviations respectively corresponding to the data types. Each pattern belongs to a data type. The data-to-clock edge deviations are utilized for tuning the write strategy parameters corresponding to the data types respectively.

18 Claims, 8 Drawing Sheets

US 8,199,619 B2

METHOD AND SYSTEM FOR TUNING WRITE STRATEGY PARAMETERS UTILIZING DATA-TO-CLOCK EDGE DEVIATIONS

BACKGROUND

The present invention relates to write strategy tuning of an optical storage device, and more particularly, to method and system for tuning write strategy parameters utilizing data-to-clock edge deviations.

As multimedia application technology continues to progress, the demand for storing massive digital data rapidly increases. As a result, high storage volume and compact size optical storage media such as Compact Discs (CDs) or Digital Versatile Discs (DVDs) have become highly popular, and optical storage devices such as CD drives or DVD drives have become standard accessories of personal computers, utilized for performing the multimedia applications.

Take the CD drive as an example. When the CD drive is controlled to write data to a CD-Rewritable (CD-RW) disc, the writing power of a laser diode in the CD drive is usually set to be a specific value, and write pulses corresponding to the data are utilized for forming pits and lands onto the grooves of the CD-RW disc. The specific value of the writing power can be derived from an optimal power calibration (OPC) process. Through a write strategy tuning process, which is also referred to as a recording strategy tuning process, changing write strategy parameters for controlling widths of the write pulses increases the accuracy of lengths of pits and lands formed on the CD-RW disc.

According to the related art, a specific device such as an oscilloscope can be utilized during the write strategy tuning process. Usually, according to an eye pattern of a plurality of reproduced waveforms shown on the oscilloscope after an advance trial writing process, a new set of write strategy parameters for controlling the widths of the write pulses are determined, based on experience, by an engineer or researcher. Utilizing this method takes a lot of time because the same process must be repeatedly performed for various applicable media and different recording speeds. The write strategy tuning process at least includes writing test data, inspecting an eye pattern of reproduced waveforms shown on the oscilloscope, and determining a new set of write strategy parameters by experience according to the eye pattern. The write strategy tuning process mentioned above is time consuming since determining the write strategy parameters by inspecting eye patterns is not an automatic operation. In addition, the write strategy tuning process mentioned above is indefinite since determining a new set of write strategy parameters according to the eye pattern is not quantitative. Under certain situations, an unclear eye pattern would invalidate or interfere with the write strategy tuning process.

A specific instrument such as a time interval analyzer (TIA) or a jitter meter could be helpful for the purpose of deriving information for determining a new set of write strategy parameters. However, similar routine work is still required, and if the TIA or jitter meter is simply coupled for measuring without an additional control system being set up, the same drawbacks caused by the manual tuning process will still exist. In addition, the information derived from the specific instrument is usually implicit and therefore the process still takes a large amount of time.

According to the related art, pattern dependency such as relationships between pit lengths and land lengths can be utilized in a write strategy tuning process. However, deriving the pattern dependency requires lots of calculations.

SUMMARY

It is an objective of the claimed invention to provide methods and systems for tuning a plurality of write strategy parameters of an optical storage device.

An exemplary embodiment of a method for tuning write strategy parameters comprises detecting a plurality of patterns, each pattern corresponding to a pit or a land on a phase-changed type optical storage medium accessed by an optical storage device, performing calculations corresponding to a plurality of data types, and generating data-to-clock edge deviations which respectively correspond to the data types. Each pattern belongs to a data type. The data-to-clock edge deviations are utilized for tuning the write strategy parameters respectively corresponding to the data types.

An exemplary embodiment of a system for tuning write strategy parameters of an optical storage device comprises a detector, a calculation module, and a controller. The detector detects a plurality of patterns, each pattern corresponding to a pit or a land on a phase-changed type optical storage medium accessed by the optical storage device. The calculation module coupled to the detector performs calculations corresponding to data types, and generates data-to-clock edge deviations, respectively corresponding to the data types. Each pattern belongs to a data type. The controller is coupled to the detector and the calculation module, and the controller utilizes the data-to-clock edge deviations for tuning the write strategy parameters respectively corresponding to the data types.

These and other objectives of the present invention will no doubt become obvious to those of ordinary skill in the art after reading the following detailed description of the preferred embodiment that is illustrated in the various figures and drawings.

DETAILED DESCRIPTION

The present invention provides methods and systems for tuning a plurality of write strategy parameters of an optical storage device by utilizing data-to-clock edge deviations.

According to a first aspect, one of the systems is a circuit for tuning the write strategy parameters, where the circuit is positioned in the optical storage device. According to a second aspect, one of the systems is substantially the optical storage device itself. For simplicity, the first aspect is utilized in the following description. However, the second aspect is also applicable to the detailed embodiments.

Figure 1:
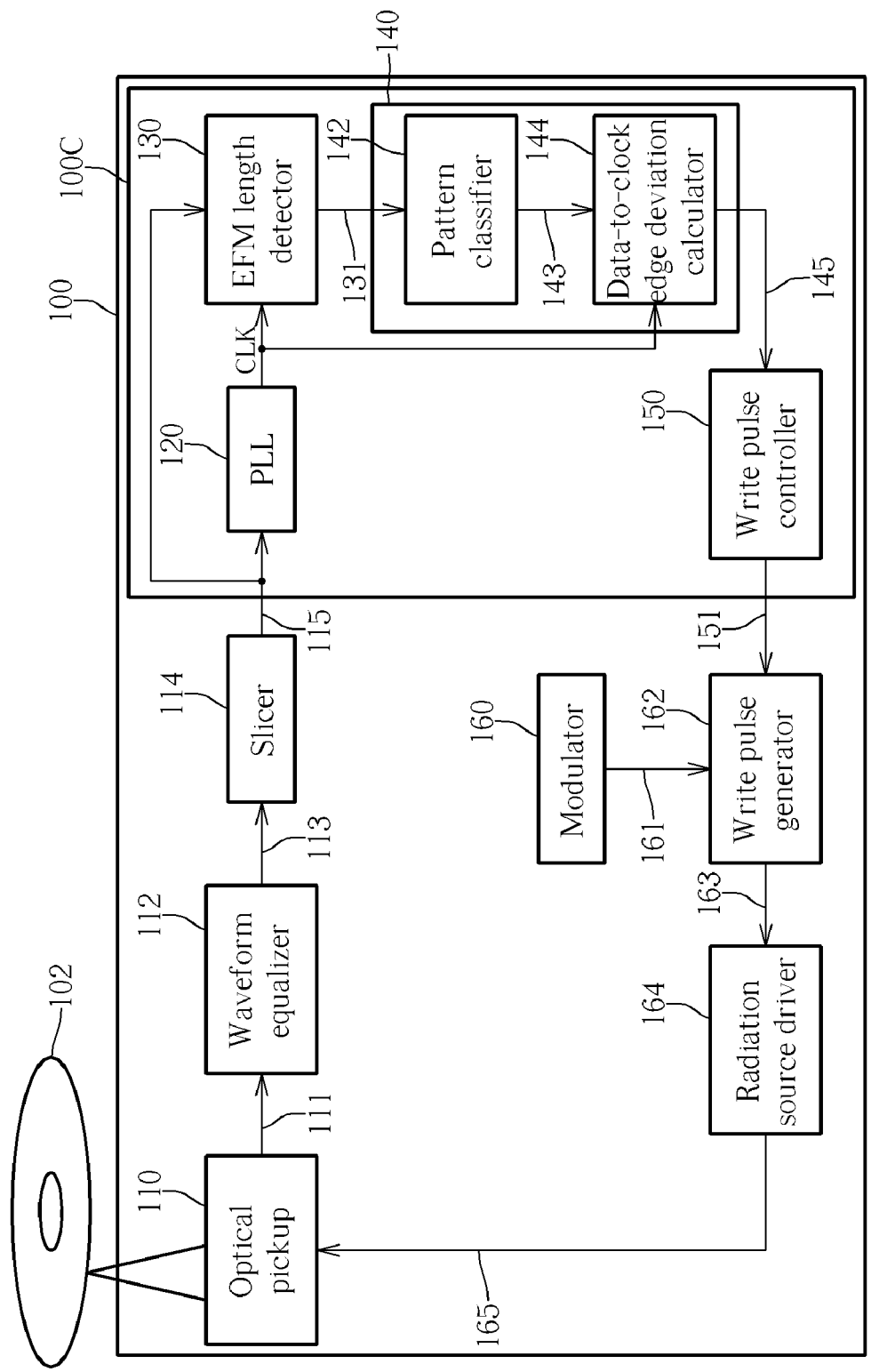
FIG. 1 is a block diagram of a system for tuning write strategy parameters of an optical storage device according to one embodiment of the present invention.

FIG. 1 illustrates a block diagram of a system 100C for tuning a plurality of write strategy parameters of an optical storage device 100 according to a first embodiment, where the system 100C is a circuit positioned in the optical storage device 100 accessing an optical storage medium 102. Please note that in the present invention, a recording layer of the optical storage medium 102 is made of a phase-changed material, so the optical storage medium 102 is also referred to as a phase-changed type optical storage medium. For example, the optical storage medium 102 can be a rewritable (RW) medium such as a CD-RW disc, a DVD-RW disc, a DVD+RW disc, a DVD-RAM disc, a HD-DVD disc, or a Blu-ray disc (BD), where the optical storage device 100 is a corresponding optical disc drive that is capable of accessing the optical storage medium 102 (e.g. a CD drive, a DVD drive, a HD-DVD drive, or a BD drive). The first embodiment is described by utilizing a DVD-RW disc as the optical storage medium 102 and by utilizing a DVD drive as the optical storage device 100.

As shown in FIG. 1, an optical pickup 110 of the optical storage device 100 reads data from the optical storage medium 102 to generate a raw radio frequency (RF) signal 111 in a reading mode of the optical storage device 100. A waveform equalizer 112 of the optical storage device 100 equalizes the raw RF signal 111 to generate a reproduced signal, which is the RF signal 113 in the first embodiment. In addition, a slicer 114 of the optical storage device 100 slices the RF signal 113 to generate a sliced signal 115. Operation principles of the optical pickup 110, the waveform equalizer 112, and the slicer 114 are well known in the art and therefore not described in detail here.

Within the optical storage device 100 shown in FIG. 1, a modulator 160, a write pulse generator 162, and a radiation source driver 164 co-operate to drive the optical pickup 110 according to the write strategy parameters, which are tuned by the system 100C through a control signal 151 according to the sliced signal 115. The modulator 160 is coupled to an encoder (not shown) of the optical storage device 100 for modulating encoded data outputted by the encoder to generate a modulated signal 161, which carries eight-to-fourteen modulation (EFM) information. Please note that in the related art the term EFM plus (EFM+) is often used for distinguishing DVDs or DVD drives, however, it is not an objective of the present invention to distinguish the usage of the terms EFM and EFM+, and the term EFM is used in related descriptions herein for simplicity. The write pulse generator 162 generates write pulses corresponding to the EFM information carried by the modulated signal 161 according to the write strategy parameters mentioned above, and outputs the write pulses carried by a write pulse signal 163. In addition, the radiation source driver 164 generates a driving signal 165 according to the write pulse signal 163 to drive the optical pickup 110. Operation principles of the modulator 160, the write pulse generator 162, and the radiation source driver 164 are well known in the art and therefore not described in detail here.

Figure 2:
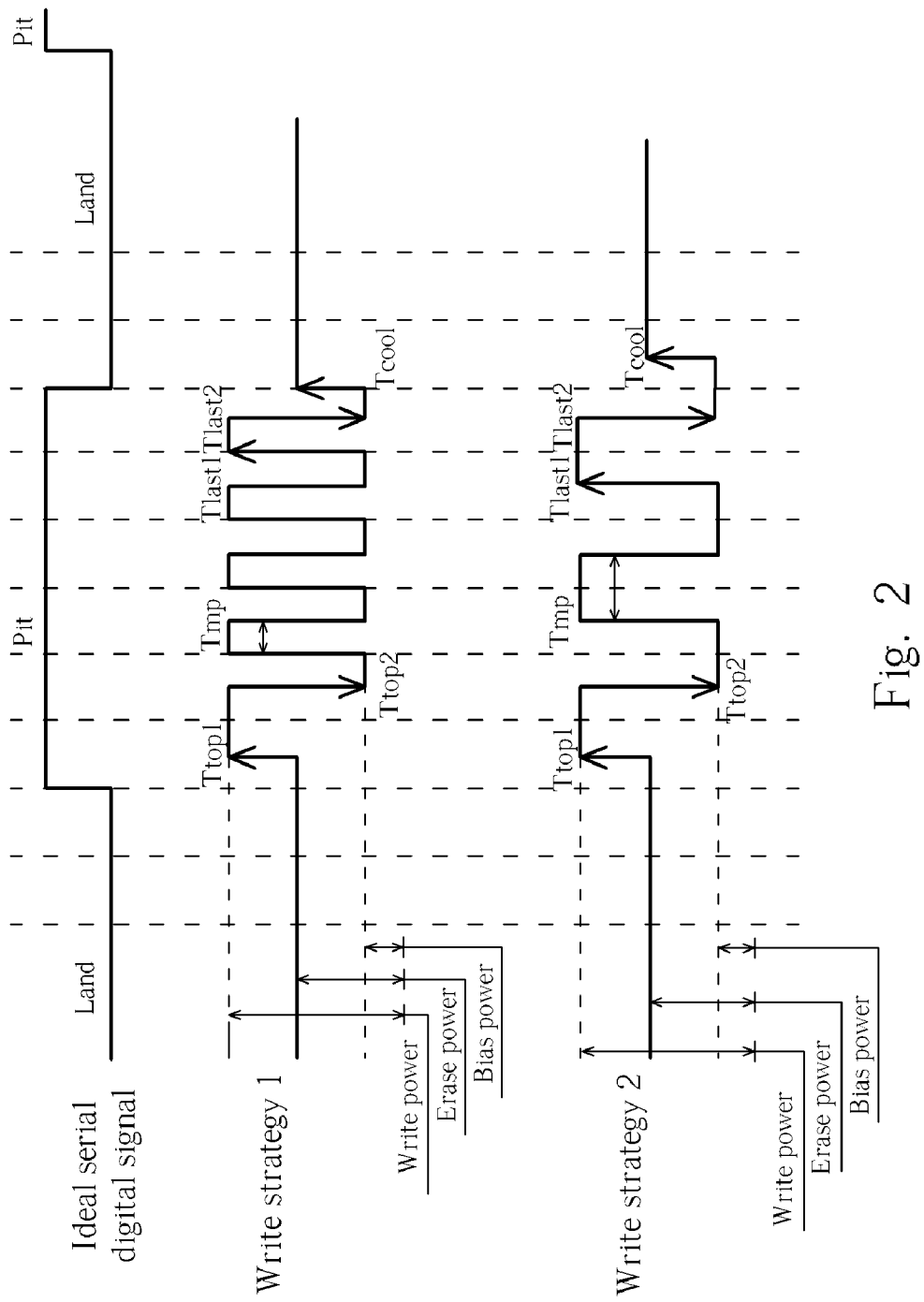
FIG. 2 illustrates the write strategy parameters that can be tuned by utilizing data-to-clock edge deviations according to one embodiment of the present invention.

FIG. 2 illustrates the write strategy parameters that can be tuned by utilizing the data-to-clock edge deviations according to this embodiment, where the write strategy parameters of a first write strategy (i.e. the "Write strategy 1" shown in FIG. 2) and a second write strategy (i.e. the "Write strategy 2" shown in FIG. 2) are listed with respect to an ideal serial digital signal, which has idealized waveforms of a serial digital signal such as the sliced signal 115. The write strategy parameters Ttop1, Ttop2, Tlast1, Tlast2, and Tcool respectively correspond to certain edge delays (or edge shifts), and the write strategy parameter Tmp corresponds to a certain pulse width. In addition, the write strategy parameters such as the write power, the erase power, and the bias power shown in FIG. 2 respectively correspond to certain power levels, where P_write, P_erase, and P_bias are respectively utilized for denoting the write power, the erase power, and the bias power. As shown in FIG. 2, the write strategy parameters such as Ttop1, Ttop2, Tmp, Tlast1, Tlast2, and Tcool can be utilized for controlling the beginning location and the end location of pits.

Please refer to FIG. 1. According to the first embodiment, the system 100C comprises a phase-locked loop (PLL) 120, a detector such as an EFM length detector 130 shown in FIG. 1, a calculation module 140, and a controller such as a write pulse controller 150 shown in FIG. 1, where the calculation module 140 comprises a pattern classifier 142 and a data-to-clock edge deviation calculator 144. The PLL 120 generates an EFM data clock CLK according to the sliced signal 115 by locking the channel bit rate (1/T) of the sliced signal 115, where the period of the EFM data clock CLK is considered to be 1T. The EFM length detector 130 derives EFM information carried by the sliced signal 115 according to the EFM data clock CLK, and detects a plurality of patterns, where each pattern corresponds to a length of a pit or a land formed on the optical storage medium 102 (i.e. a pit length or a land length), and the pit and the land respectively correspond to amorphous and crystalline phases of the phase-changed material mentioned above. Please note that the recording layer can be crystallized initially on the production line of the optical storage medium 102. In addition, the recording layer can be re-crystallized with a predetermined power level (e.g. an erase power level) by the optical pickup 110 as needed. As the pit is recorded typically by alternately melting and quenching the phase-changed material with a sequence of short laser pulses to prevent crystallization occurring, the pit has lower reflectance in contrast to the land. Regarding the characteristics mentioned above, the write strategy parameters can be tuned according to the forming quality of pits and lands on the optical storage medium 102, where the data-to-clock edge deviations are substantially indications of the forming quality of pits and lands on the optical storage medium 102.

The sliced signal 115 is typically a square wave having various intervals between rising edges and falling edges thereof and various intervals between falling edges and rising edges thereof. In this embodiment, the EFM length detector 130 measures intervals between rising edges and falling edges of the sliced signal 115 and/or intervals between falling edges and rising edges of the sliced signal 115 as the patterns mentioned above, where each interval corresponds to a pit length or a land length. As a result, the patterns comprise pit lengths P corresponding to pits, and land lengths L corresponding to lands. Each of the pit lengths P represents a pit recorded along a track on the optical storage medium 102, and each of the land lengths L represents a land along the track. Please note that the sliced signal 115 of another embodiment of the present invention may carry other information complying with a variation of the EFM specification.

In the first embodiment, the pit lengths and the land lengths derived from the sliced signal 115 are multiples of clock period T and ranging from 3T to 14T but not including 12T and 13T in an ideal case of the DVD-RW disc. That is, a pattern P of a pit or a pattern L of a land can be a length out of 3T, 4T, ..., 10T, 11T, and 14T. It is therefore reasonable that a reference signal for measuring the patterns of the pits and the lands (e.g. the EFM data clock CLK) has a period less than or equal to T. According to this embodiment, the reference signal inputted into the EFM length detector 130 is the EFM data clock CLK, so the period of the reference clock is T. In a real case of the DVD-RW disc, the patterns L and P carried by the output signal 131 of the EFM length detector 130 are usually not exact multiples of T. The calculation module 140 performs calculations base on the patterns and a plurality of corresponding data types to generate a plurality of data-to-clock edge deviations respectively. Each of the data types corresponds to a specific target pit length (e.g. 3T, 4T, ..., 10T, 11T, or 14T) or a specific target land length (e.g. 3T, 4T, ..., 10T, 11T, or 14T). Each pattern should belong to a data type. The data-to-clock edge deviations are carried by an output signal 145 of the data-to-clock edge deviation calculator 144.

The pattern classifier 142 classifies the patterns L and P into data types. Here, notations such as $P_{nT}$ or $L_{mT}$ (where n=3, 4, ..., 10, 11, or 14; and m=3, 4, ..., 10, 11, or 14 in this embodiment) are utilized for denoting the data types mentioned above, nT or mT indicating the length in terms of the clock period T. Each of the data types $L_{mT}$, e.g. a data type $L_{3T}$ having m=3, is utilized for classifying patterns L corresponding to a land having a target land length of 3T. Similarly, each of the data types $P_{nT}$, e.g. a data type $P_{3T}$ having n=3, is utilized for classifying patterns P corresponding to a pit having a target pit length of 3T. The total number of data types can be derived as the sum of the number of possible values for n and the number of possible values for m. As there are 10 possible values for n and m in this embodiment, so the total number of data types is 10+10=20.

In this embodiment, the pattern classifier 142 classifies the patterns L as data type $L_{mT}$ if the patterns L satisfy the following inequality:

$$(m-0.5) \times T \leq L \leq (m+0.5) \times T.$$

Similarly, the pattern classifier 142 may classify the patterns P as data type $P_{nT}$ if the patterns P satisfy the following inequality:

$$(n-0.5) \times T \leq P \leq (n+0.5) \times T.$$

For example, a pattern with a land length between 2.6T and 3.5T should be classified into the data type $L_{3T}$.

Please refer to FIG. 1. The data-to-clock edge deviation calculator 144 calculates the data-to-clock edge deviations respectively corresponding to the data types $P_{nT}$ and $L_{mT}$ as follows. The data-to-clock edge deviation calculator 144 calculates a plurality of data-to-clock edge shifts, where each data-to-clock edge shift is an interval between a rising/falling edge of the reference clock mentioned above (i.e. the EFM data clock CLK in this embodiment) and a transition edge of the sliced signal 115. It is noted that the transition edge of the sliced signal 115 is considered to be a pattern edge, and the rising/falling edge of the reference clock is considered to be a target edge. Additionally, the data-to-clock edge deviation calculator 144 calculates a plurality of differences to generate the data-to-clock edge deviations respectively corresponding to the data types $P_{nT}$ and $L_{mT}$. Each of the differences mentioned above is a difference between a data-to-clock edge shift and a target data-to-clock edge shift that is a predetermined value corresponding to a specific data type.

Figure 3:
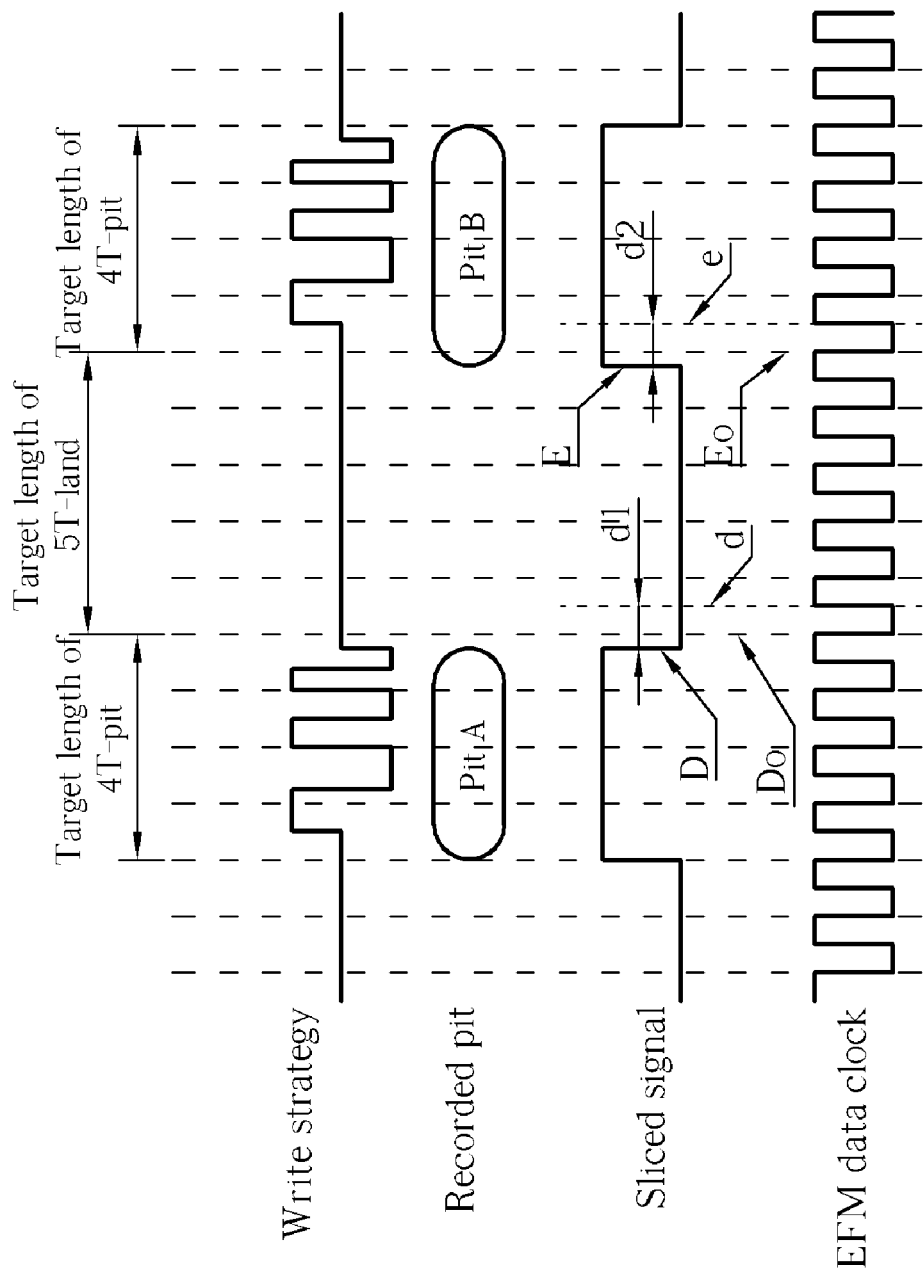
FIG. 3 illustrates data-to-clock edge shifts utilized for generating data-to-clock edge deviations according to one embodiment of the present invention.

Take the situation shown in FIG. 3 as an example. FIG. 3 illustrates certain data-to-clock edge shifts utilized for generating some of the data-to-clock edge deviations according to the first embodiment, where two pits A and B to be classified into a data type $P_{4T}$ and a land there between (between pits A and B) to be classified into a data type $L_{5T}$ are illustrated. In this embodiment, the data-to-clock edge shift d1 is an interval between time point D of a falling edge of the sliced signal 115, i.e. the time point corresponding to the end location of pit A, and a subsequent rising edge of the EFM data clock CLK, e.g. time point d. Please note that time point D is substantially the same time point as when the value of the RF signal 113 crosses the predetermined value such as the value corresponding to the slicing level of the slicer 114. The data-to-clock edge deviation calculator 144 detects time point D by detecting the transition of the sliced signal 115 from high to low. The same method can be applied to calculate each of the data-to-clock edge shifts corresponding to any data type. Additionally, the data-to-clock edge deviation calculator 144 calculates a plurality of differences to generate data-to-clock edge deviations corresponding to the data types. Each of the differences mentioned above is a difference between a data-to-clock edge shift and a target data-to-clock edge shift, for example, 0.5T in this embodiment. The target data-to-clock edge shift corresponding to the end location of pit A is 0.5T because the time point corresponding to the end location of pit A in an ideal case should be time point Do.

In some embodiments, the data-to-clock edge deviation calculator 144 generates the data-to-clock edge deviation of a particular data type by conducting statistics analysis on the differences corresponding to the data type. The statistics analysis may involve averaging the difference, or finding the most frequent value of the differences.

Similarly, the data-to-clock edge deviation calculator 144 calculates a data-to-clock edge shift d2, which is an interval between time point E of a rising edge of the sliced signal 115, i.e. the time point corresponding to the beginning location of pit B, and a subsequent rising edge of the EFM data clock CLK, e.g. time point e. Please note that time point E is substantially the same time point as when the value of the RF signal 113 crosses the predetermined value such as the value corresponding to the slicing level of the slicer 114. The data-to-clock edge deviation calculator 144 detects time point E by detecting the transition of the sliced signal 115 from low to high. The same method can be applied to calculate the data-to-clock edge shifts corresponding to any data type. Additionally, the data-to-clock edge deviation calculator 144 calculates a plurality of differences to generate data-to-clock edge deviations corresponding to the data types, where each of the differences mentioned above is a difference between a data-to-clock edge shift and a target data-to-clock edge shift. In this embodiment, the target data-to-clock edge shift corresponding to the beginning location of pit B is determined to be 0.5T because the time point corresponding to the beginning location of pit B in an ideal case should be time point Eo.

It is noted that the classification information generated by the pattern classifier 142 can be sent to the write pulse controller 150 through the data-to-clock edge deviation calculator 144 if needed since the transmission from the data-to-clock edge deviation calculator 144 to the write pulse controller 150 is digital. Similarly, the detection result(s) generated by the EFM length detector 130 can be sent to the data-to-clock edge deviation calculator 144 through the pattern classifier 142 if needed since the transmission from the pattern classifier 142 to the data-to-clock edge deviation calculator 144 is digital. In a variation of the first embodiment, the write pulse controller 150 can be coupled to the pattern classifier 142 through direct connection, and the data-to-clock edge deviation calculator 144 can also be coupled to the EFM length detector 130 through direct connection.

In a variation of the first embodiment, the target data-to-clock edge shift utilized for calculating the differences to generate the data-to-clock edge deviations corresponding to a specific data type $L_{mT}$ can be an average of a plurality of data-to-clock edge shifts corresponding to the specific data type $L_{mT}$. Similarly, the target data-to-clock edge shift utilized for calculating the differences to generate the data-to-clock edge deviations corresponding to a specific data type $P_{nT}$ can be an average of a plurality of data-to-clock edge shifts corresponding to the specific data type $P_{nT}$. In another variation of the first embodiment, the target data-to-clock edge shifts utilized for calculating the differences to generate the data-to-clock edge deviations corresponding to a specific data type $L_{mT}$ or $P_{nT}$ can be an average of a plurality of data-to-clock edge shifts corresponding to the specific data type $L_{mT}$ and a plurality of data-to-clock edge shifts corresponding to the specific data type $P_{nT}$.

Also referring to FIG. 2, according to this embodiment, the write strategy parameters Ttop1(n) and Ttop2(n) represent the write strategy parameters for controlling the beginning location of the pits corresponding to the data types $P_{nT}$, and the write strategy parameters Tlast1(n) and Tlast2(n) represent the write strategy parameters for controlling the end location of the pits corresponding to the data types $P_{nT}$. Here, pit A corresponds to a data type $P_{4T}$, the adjacent land following thereof (i.e. the 5T-land between pits A and B) corresponds to a data type $L_{5T}$, and pit B also corresponds to the data type $P_{4T}$. In addition, the write strategy parameters Tlast1(n) and Tlast2(n) corresponding to the end location of pit A are respectively referred to as Tlast1(4) and Tlast2(4), and the write strategy parameters Ttop1(n) and Ttop2(n) corresponding to the beginning location of pit B are respectively referred to as Ttop1(4) and Ttop2(4). Regarding the 5T-land between pits A and B, the write strategy parameters Tcool(m) and P_erase(m) can be associated with the data type $L_{5T}$. For example, the write strategy parameter Tcool(m) can be utilized for controlling the beginning location of the lands corresponding to the data types $L_{mT}$. In addition, the write strategy parameter and P_erase(m) can be utilized for controlling the beginning and end locations of the lands corresponding to the data types $L_{mT}$. Similar descriptions are not repeated in detail here.

It is noted that the write strategy parameters such as those shown in FIG. 2 can be tuned automatically since specific devices (e.g. the oscilloscope mentioned above) are no longer required according to the present invention. In addition, without the utilization of external devices, the write pulse controller 150 may tune the write strategy parameters according to the data-to-clock edge deviations generated by the calculation module 140, so the write strategy parameters can be tuned automatically on system or on chip according to the present invention. Through tuning the write strategy parameters according to the data-to-clock edge deviations, pit lengths or land lengths corresponding to data newly written on the optical storage medium 102 utilizing the latest updated write strategy parameters may approach target multiples of T.

Figure 4:
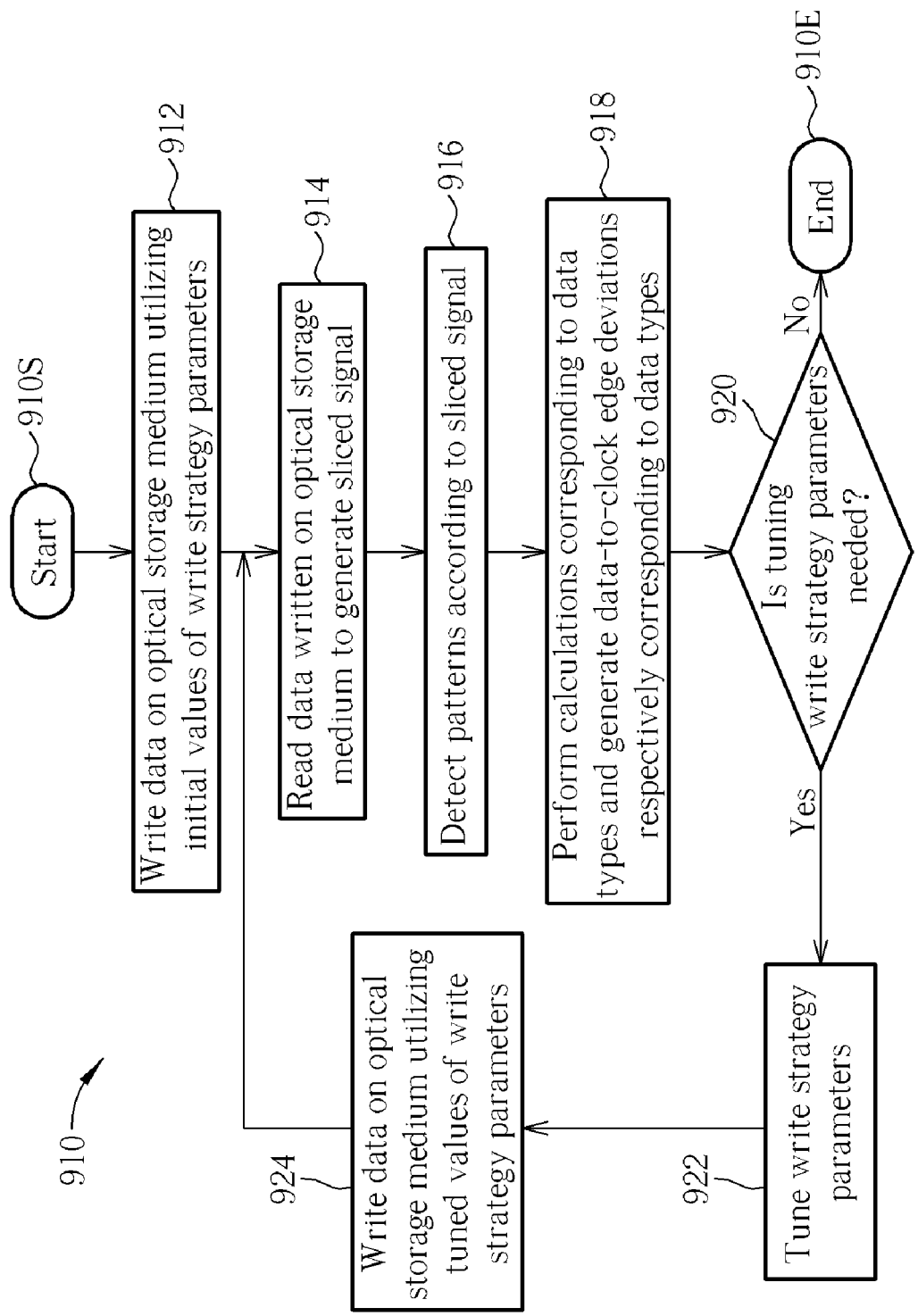
FIG. 4 is a flowchart of a method for tuning write strategy parameters according to one embodiment of the present invention.

FIG. 4 illustrates a flowchart of a method 910 for tuning write strategy parameters of an optical storage device according to one embodiment of the present invention. The method 910 may be implemented by system 100C shown in FIG. 1.

In Step 912, under the control of a firmware code executed by a micro-processing unit (MPU) of the optical storage device 100, the optical storage device 100 writes data on the phase-changed type optical storage medium 102 utilizing initial values of the write strategy parameters corresponding to a specific rotational speed of the optical storage device 100.

In Step 914, the optical storage device 100 reads the data newly written on the optical storage medium 102 to generate the sliced signal 115.

In Step 916, the EFM length detector 130 of the system 100C detects patterns P of pits and patterns L of lands by measuring the sliced signal 115. Each of the patterns P and L belongs to a specific data types $P_{nT}$ or $L_{mT}$, where n=3, 4, . . . , 10, 11, or 14, and m=3, 4, . . . 10, 11, or 14 in this embodiment.

In Step 918, the calculation module 140 calculates data-to-clock edge deviations corresponding to data types $L_{mT}$ and $P_{nT}$.

In Step 920, the MPU executing the firmware code determines if tuning of the write strategy parameters is needed. If any of the data-to-clock edge deviations is greater than a specific threshold, the MPU executing the firmware code determines that tuning of the write strategy parameters is needed, so Step 922 will be executed; otherwise, the method proceeds directly to Step 910E. The MPU may determine to enter Step 922 directly without examining Step 920 if initial values of the write strategy parameters are certain to be imperfect. In addition, although the write strategy parameters described in Steps 920 and 922 are plural write strategy parameters for simplicity as shown in FIG. 4, this is not a limitation of the present invention. Both Steps 920 and 922 can be described utilizing a singular form of "write strategy parameter" if tuning of only a single write strategy parameter is needed. Repeated explanation of the singular or plural form for similar situations is therefore unnecessary in the following.

If the MPU executing the firmware code determines to enter Step 922, the system 100C tunes the write strategy parameters utilizing the data-to-clock edge deviations as mentioned.

In Step 924, under the control of the MPU executing the firmware code, the optical storage device 100 writes data on the optical storage medium 102 utilizing the latest values of the write strategy parameters.

Please note that the number of data types $L_{mT}$ and $P_{nT}$ according to another embodiment implemented for the CD-RW disc mentioned above can be derived as the sum of the number of possible values for n and the number of possible values for m, i.e., eighteen, since n=3, 4, . . . , 10, 11 and m=3, 4, . . . , 10, 11 for the CD-RW disc.

Figure 5:
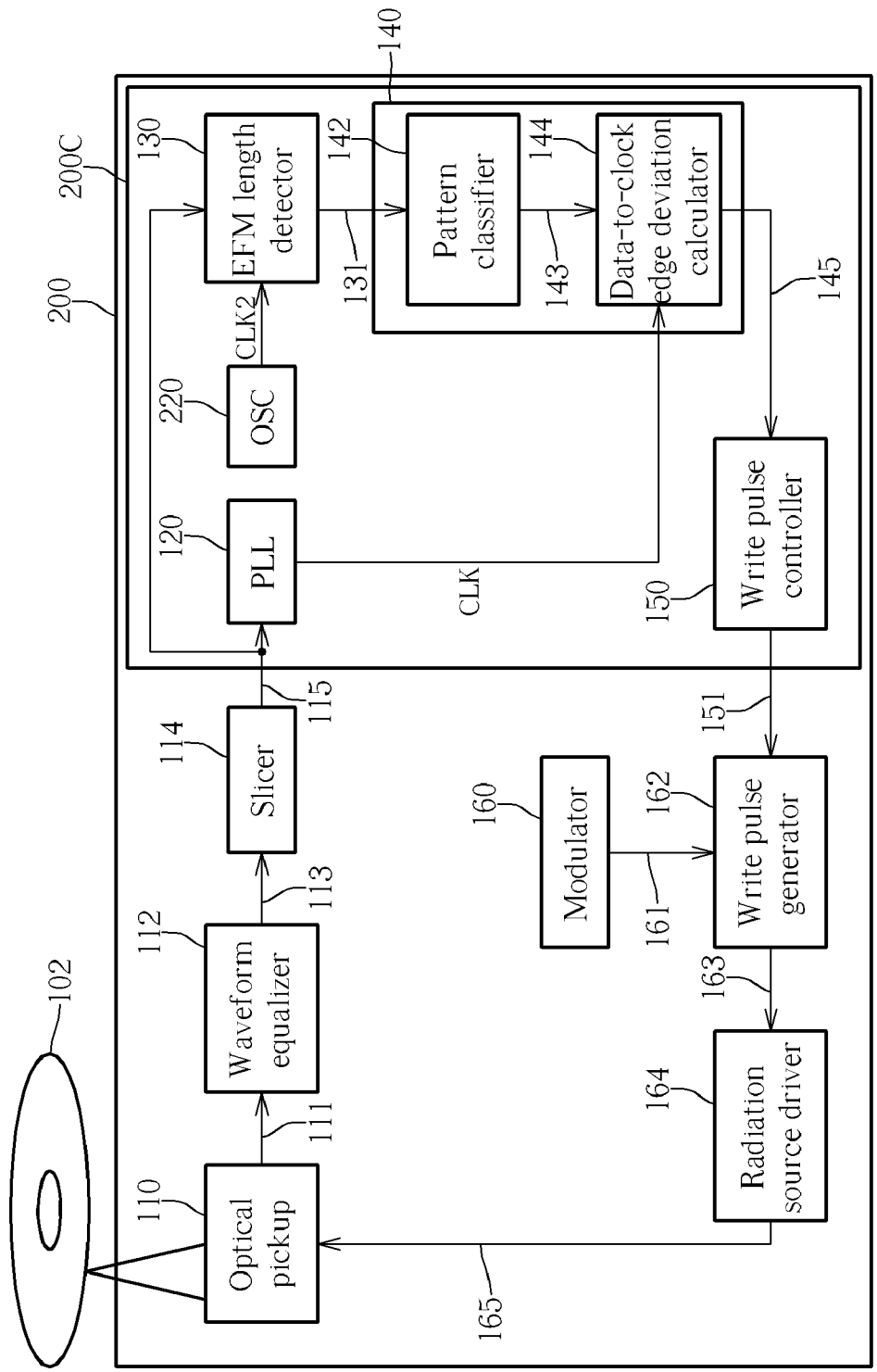
FIG. 5 is a block diagram of a system for tuning write strategy parameters of an optical storage device according to one embodiment of the present invention.

FIG. 5 is a block diagram of a system 200C for tuning write strategy parameters of an optical storage device 200 according to a second embodiment of the present invention. The second embodiment is similar to the first embodiment, where the differences are described as follows. The reference signal inputted into the EFM length detector 130 is a reference clock CLK2 generated by an oscillator 220. It is not necessary for the frequency of the reference clock CLK2 to be equal to the frequency of the EFM data clock CLK.

Figure 6:
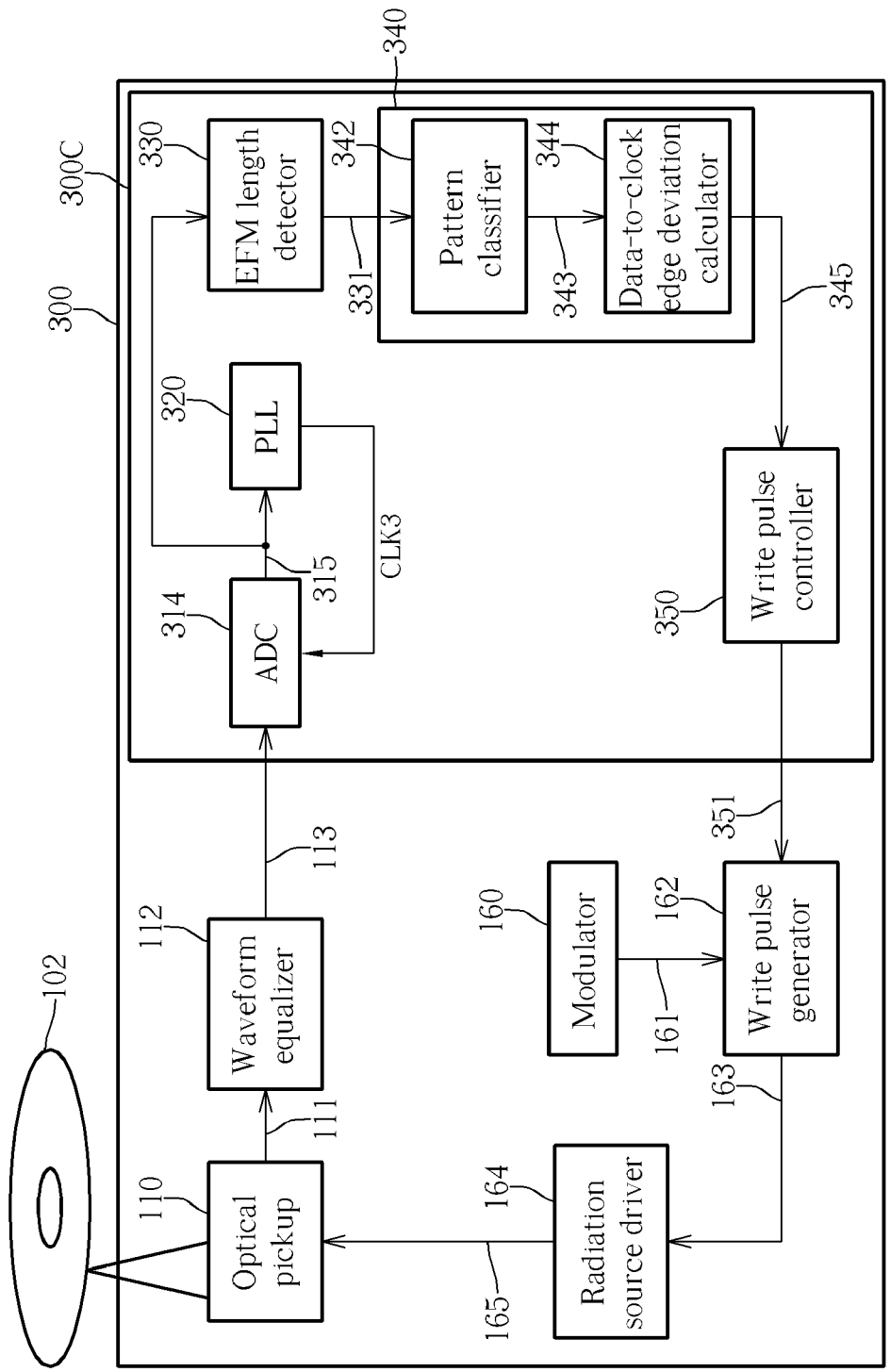
FIG. 6 is a block diagram of a system for tuning write strategy parameters of an optical storage device according to one embodiment of the present invention.

FIG. 6 is a block diagram of a system 300C for tuning write strategy parameters of an optical storage device 300 according to a third embodiment of the present invention. The third embodiment is similar to the first embodiment, where the differences are described as follows. The system 300C comprises a sampling circuit coupled to the waveform equalizer 112 to receive the reproduced signal such as the RF signal 113. The sampling circuit is utilized for sampling the reproduced signal to generate a digital signal, which is a digital RF signal 315 in this embodiment. As shown in FIG. 6, the sampling circuit comprises an analog-to-digital converter (ADC) 314 and a PLL 320. The ADC 314 performs analog-to-digital conversion on the RF signal 113 according to a reference clock CLK3 to generate the digital RF signal 315, and the PLL 320 generates the reference clock CLK3 according to the digital RF signal 315.

The system 300C further comprises an EFM length detector 330, a calculation module 340, and a write pulse controller 350, where the calculation module 340 comprises a pattern classifier 342 and a data-to-clock edge deviation calculator 344. The signal utilized for detecting the lengths is the digital RF signal 315, and not the sliced signal 115. The EFM length detector 330 detects intervals between time points by observing the value of the digital RF signal 315, and generates the lengths of the intervals, where each interval corresponds to a pit or a land. The boundary of the intervals can be determined by a predetermined value, for example, a middle value between a maximum value and a minimum value carried by the digital RF signal 315, e.g. an average of the maximum and minimum values. Such a middle value plays a role like the slicing level mentioned in the previous embodiments.

Figure 7:
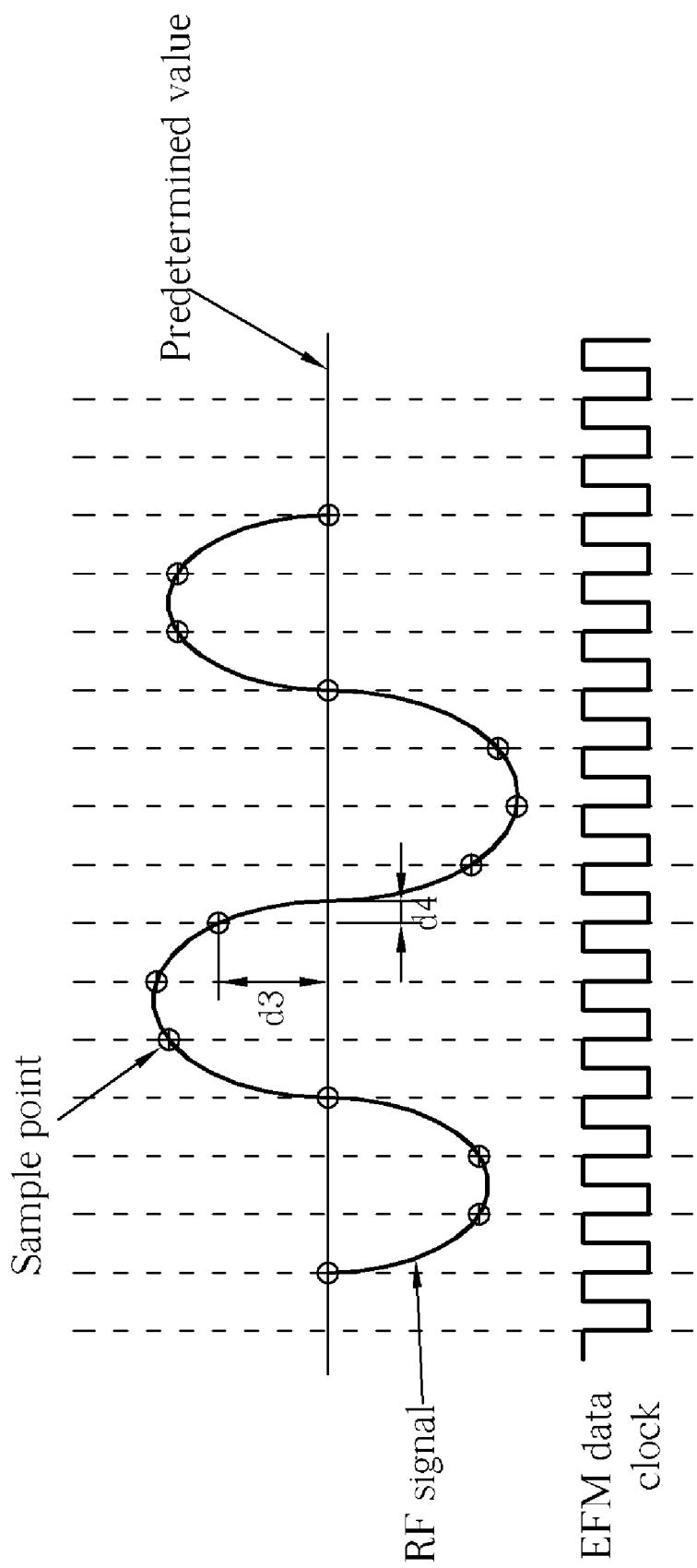
FIG. 7 illustrates sample points on a reproduced signal with respect to an EFM data clock, where a difference between a specific sample point's value and a predetermined value is utilized for representing a data-to-clock edge deviation according to one embodiment of the present invention.

FIG. 7 illustrates sample points (which are drawn with "⊕") on a reproduced signal such as the RF signal 113, where a difference d3 between a specific sample point's value and a predetermined value (for example, the middle value mentioned above) can be an indication of a data-to-clock edge deviation d4. According to the waveform of the RF signal shown in FIG. 7, most of the sample points crossing the predetermined value are perfectly aligned to falling edges of the EFM data clock, so the values of most data-to-clock edge deviations are zero. The specific sample point's value mentioned above means a value sampled at the specific sampling time and carried by the digital RF signal 315. Differences between sample points' value and the predetermined value (for example, the difference d3) can represent data-to-clock edge deviations (for example, the data-to-clock edge deviation d4), and the lengths and the data-to-clock edge deviations can be derived accordingly. Therefore, the calculation module 340 may derive the data-to-clock edge deviations by calculating differences between a predetermined value (for example, the middle value) and the value of the digital RF signal 315 around the time points when the value of the digital RF signal 315 crosses the predetermined value.

Here, the pattern classifier 342 performs the same function as the pattern classifier 142 while the EFM length detector 330 may output patterns L and P carried by the output signal 331 similar to the output signal 131. The data-to-clock edge deviation calculator 344 of this embodiment calculates the data-to-clock edge deviations utilizing the approached direct line mentioned above. In addition, the write pulse controller 350 performs the same function as the write pulse controller 150 while the calculation module 340 may output the data-to-clock edge deviations carried by the output signal 345 similar to the output signal 145.

Figure 8:
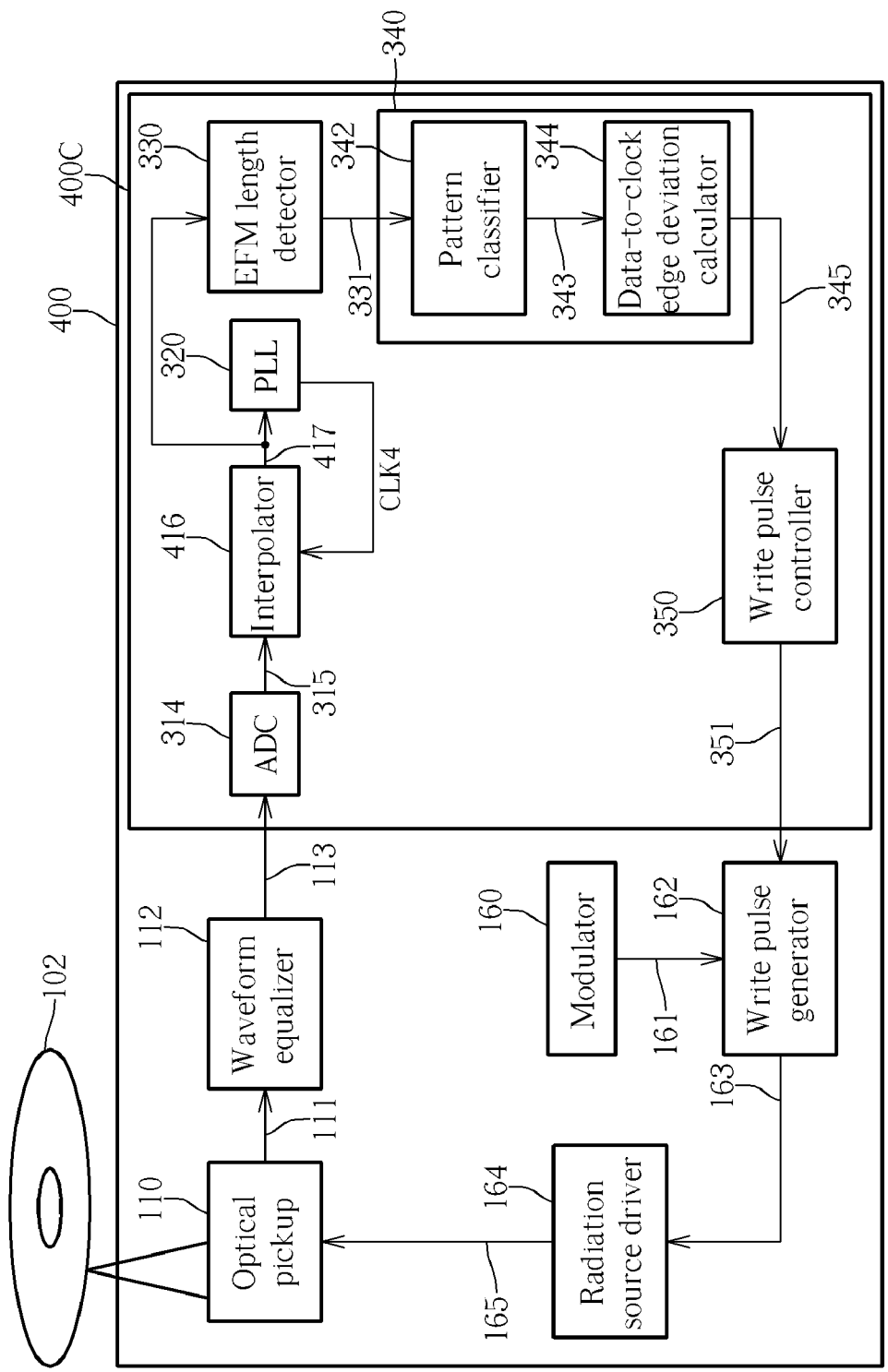
FIG. 8 illustrates a variation of the embodiment shown in FIG. 6.

FIG. 8 illustrates a variation of the embodiment shown in FIG. 6, where an interpolator 416 coupled between the ADC 314 and the PLL 320 is utilized. The PLL 320 generates a reference clock CLK4 according to an interpolated signal 417 generated by the interpolator 416, and the interpolator 416 performs an interpolation operation according to the digital RF signal 315 and the reference clock CLK4. In this variation, the input of the EFM length detector 330 is replaced with the interpolated signal 417. Operation principles of the interpolator 416 are well known in the art and therefore not described in detail here.

It should be noted that the present invention could be implemented by means of hardware including a plurality of distinct elements, or by means of a suitably programmed computer. In the system claims detailing a plurality of means, several means can be embodied by the same hardware or software device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for tuning a plurality of write strategy parameters of an optical storage device, comprising:
   detecting a plurality of patterns, each pattern corresponding to a pit or a land on a phase-changed type optical storage medium accessed by the optical storage device;
   performing calculations corresponding to a plurality of data types and generating a plurality of data-to-clock edge deviations respectively corresponding to the data types, wherein each pattern belongs to a data type; and
   utilizing the data-to-clock edge deviations as indices for tuning the write strategy parameters respectively corresponding to the data types.

2. The method of claim 1, wherein the step of detecting the patterns further comprises:
   slicing a reproduced signal to generate a sliced signal, wherein said reproduced signal is generated by the optical storage device accessing the phase-changed type optical storage medium; and
   detecting intervals between rising edges and falling edges of the sliced signal and/or intervals between falling edges and rising edges of the sliced signal as the patterns, wherein each interval corresponds to a pit or a land.

3. The method of claim 2, wherein the step of performing calculations corresponding to the data types and generating the data-to-clock edge deviations respectively corresponding to the data types further comprises:
   calculating a plurality of data-to-clock edge shifts, each data-to-clock edge shift being an interval between a rising or falling edge of a first reference clock and a rising or falling edge of the sliced signal; and
   calculating a plurality of differences to generate the data-to-clock edge deviations respectively corresponding to the data types, each difference being a difference between a data-to-clock edge shift and a target data-to-clock edge shift, wherein the target data-to-clock edge shift is a predetermined value corresponding to a specific data type or an average of a plurality of data-to-clock edge shifts corresponding to a specific data type.

4. The method of claim 1, wherein the step of detecting the patterns further comprises:
   sampling a reproduced signal to generate a digital signal, wherein said reproduced signal is generated by the optical storage device accessing the phase-changed type optical storage medium; and
   detecting intervals between time points when the value of the digital signal crosses a predetermined value to generate the patterns, wherein each interval corresponds to a pattern.

5. The method of claim 4, wherein the step of performing calculations corresponding to the data types and generating the data-to-clock edge deviations respectively corresponding to the data types further comprises:
   calculating differences between the value of the digital signal and the predetermined value around the time points when the value of the digital signal crosses the predetermined value to generate the data-to-clock edge deviations.

6. The method of claim 4, wherein the step of sampling the reproduced signal further comprises:

performing analog-to-digital conversion on the reproduced signal according to a reference clock to generate the digital signal; and generating the reference clock according to the digital signal utilizing a phase-locked loop (PLL).

7. The method of claim 1, further comprising:
tuning the write strategy parameters automatically on system or on chip.

8. The method of claim 1, wherein the step of performing calculations corresponding to the data types and generating the data-to-clock edge deviations respectively corresponding to the data types further comprises:
classifying the patterns into the data types; and
calculating the data-to-clock edge deviations respectively corresponding to the data types.

9. A system for tuning a plurality of write strategy parameters of an optical storage device, comprising:
a detector for detecting a plurality of patterns, each pattern corresponding to a pit or a land on a phase-changed type optical storage medium accessed by the optical storage device;
a calculation module coupled to the detector for performing calculations corresponding to a plurality of data types and generating a plurality of data-to-clock edge deviations respectively corresponding to the data types, wherein each pattern belongs to a data type; and
a controller coupled to the calculation module, the controller utilizing the data-to-clock edge deviations as indices for tuning the write strategy parameters respectively corresponding to the data types.

10. The system of claim 9, further comprising:
a slicer for slicing a reproduced signal to generate a sliced signal, wherein said reproduced signal is generated by the optical storage device accessing the phase-changed type optical storage medium;
wherein the detector detects intervals between rising edges and falling edges of the sliced signal and/or intervals between falling edges and rising edges of the sliced signal as the patterns, and each interval corresponds to a pit or a land.

11. The system of claim 10, wherein the calculation module calculates a plurality of data-to-clock edge shifts and a plurality of differences to generate the data-to-clock edge deviations respectively corresponding to the data types, wherein each data-to-clock edge shift is an interval between a rising or falling edge of a first reference clock and a rising or falling edge of the sliced signal, and each difference is a difference between a data-to-clock edge shift and a target data-to-clock edge shift, wherein the target data-to-clock edge shift is a predetermined value corresponding to a specific data type or an average of a plurality of data-to-clock edge shifts corresponding to a specific data type.

12. The system of claim 9, further comprising:
a sampling circuit for sampling a reproduced signal to generate a digital signal, wherein said reproduced signal is generated by the optical storage device accessing the phase-changed type optical storage medium;
wherein the detector is coupled to the sampling circuit and detects intervals between time points when the value of the digital signal crosses a predetermined value to generate the patterns, and each interval corresponds to a pattern.

13. The system of claim 12, wherein the calculation module calculates differences between the predetermined value and the value of the digital signal around the time points when the value of the digital signal crosses the predetermined value to generate the data-to-clock edge deviations.

14. The system of claim 12, wherein the sampling circuit further comprises:
an analog-to-digital converter (ADC) for performing analog-to-digital conversion on the reproduced signal according to a reference clock to generate the digital signal; and
a phase-locked loop (PLL) coupled to the ADC for generating the reference clock according to the digital signal.

15. The system of claim 12, wherein the sampling circuit further comprises:
an analog-to-digital converter (ADC) for performing analog-to-digital conversion on the reproduced signal;
an interpolator coupled to the ADC for performing an interpolation operation according to a reference clock and results generated by the ADC to generate the digital signal; and
a phase-locked loop (PLL) coupled to the interpolator for generating the reference clock according to the digital signal.

16. The system of claim 9, wherein the write strategy parameters are tuned automatically on system or on chip.

17. The system of claim 9, wherein the calculation module further comprises:
a pattern classifier for classifying the patterns into the data types; and
a data-to-clock edge deviation calculator coupled to the pattern classifier for calculating the data-to-clock edge deviations respectively corresponding to the data types.

18. The system of claim 9, wherein a recording layer of the phase-changed type optical storage medium is made of a phase-changed material, and the pit and the land respectively correspond to different phases of the phase-changed material.

* * * * *

UNITED STATES PATENT AND TRADEMARK OFFICE
CERTIFICATE OF CORRECTION

PATENT NO. : 8,199,619 B2
APPLICATION NO. : 11/307365
DATED : June 12, 2012
INVENTOR(S) : Chih-Ching Yu et al.

It is certified that error appears in the above-identified patent and that said Letters Patent is hereby corrected as shown below:

On the title page, item (73), correct the name of the assignee from "Media Tek Inc." to --MediaTek Inc.--.

Signed and Sealed this
Fourth Day of September, 2012

David J. Kappos
*Director of the United States Patent and Trademark Office*